US009647236B2

(12) United States Patent
Fujino et al.

(10) Patent No.: US 9,647,236 B2
(45) Date of Patent: May 9, 2017

(54) PACKAGING METHOD OF ORGANIC LIGHT EMITTING DISPLAY PANEL, ORGANIC LIGHT EMITTING DISPLAY PANEL AND DISPLAY DEVICE

(71) Applicant: BOE TECHNOLOGY GROUP CO., LTD., Beijing (CN)

(72) Inventors: Seiji Fujino, Beijing (CN); Qinghui Zeng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/435,672

(22) PCT Filed: Sep. 30, 2014

(86) PCT No.: PCT/CN2014/087898
§ 371 (c)(1),
(2) Date: Apr. 14, 2015

(87) PCT Pub. No.: WO2015/180351
PCT Pub. Date: Dec. 3, 2015

(65) Prior Publication Data
US 2016/0141550 A1 May 19, 2016

(30) Foreign Application Priority Data
May 28, 2014 (CN) .......................... 2014 1 0232262

(51) Int. Cl.
H01L 51/52 (2006.01)
H01L 51/56 (2006.01)

(52) U.S. Cl.
CPC .......... *H01L 51/5253* (2013.01); *H01L 51/56* (2013.01); *H01L 2251/301* (2013.01); *H01L 2251/303* (2013.01)

(58) Field of Classification Search
USPC ............................................... 257/40; 438/28
See application file for complete search history.

(56) References Cited

U.S. PATENT DOCUMENTS

2004/0137142 A1* 7/2004 Nishikawa .......... H01L 27/3276
427/66
2006/0028606 A1* 2/2006 Takeguchi ............ H01L 27/124
349/149

(Continued)

FOREIGN PATENT DOCUMENTS

CN 1501750 A 6/2004
CN 101026228 A 8/2007

(Continued)

OTHER PUBLICATIONS

Feb. 6, 2015—International Search Report for PCT/CN2014/087898 with Eng Tran of Written Opinion.

(Continued)

*Primary Examiner* — Zandra Smith
*Assistant Examiner* — Lawrence Tynes, Jr.
(74) *Attorney, Agent, or Firm* — Banner & Witcoff, Ltd.

(57) ABSTRACT

A packaging method for an organic light emitting display panel, an organic light emitting display panel and a display device are disclosed. The packaging method includes: forming a water/oxygen blocking layer that covers a whole base substrate on the base substrate with an organic light emitting device and a peripheral bonding region formed thereon, etching the water/oxygen blocking layer on the base substrate, so as to at least remove the water/oxygen blocking layer on a connection terminal within the bonding region, and to retain the water/oxygen blocking layer on the organic light emitting device. With the packaging method, an organic light emitting display panel with a narrow frame can be realized.

14 Claims, 4 Drawing Sheets

(56) References Cited

U.S. PATENT DOCUMENTS

| | | | |
|---|---|---|---|
| 2006/0192915 A1 | 8/2006 | Kimura | |
| 2009/0288680 A1* | 11/2009 | Kaneko | H01L 27/3276 134/4 |
| 2012/0043543 A1* | 2/2012 | Saito | H01L 29/66765 257/57 |

FOREIGN PATENT DOCUMENTS

| | | |
|---|---|---|
| CN | 101340747 A | 1/2009 |
| CN | 101621013 A | 1/2010 |
| CN | 102485937 A | 6/2012 |
| CN | 103081159 A | 5/2013 |
| CN | 103222340 A | 7/2013 |
| CN | 103794739 A | 5/2014 |
| CN | 104022233 A | 9/2014 |
| JP | 2009205941 A | 9/2009 |
| JP | 2014002880 A | 1/2014 |

OTHER PUBLICATIONS

Dec. 29, 2014—(CN) First Office Action of Application No. 201410232262.0 with Eng Tran.

Mar. 25, 2015—(CN) Second Office Action of Application No. 201410232262.0 with Eng Tran.

\* cited by examiner forming a water/oxygen blocking layer covering the whole base substrate on a base substrate with OLEDs and a circuit layer in a peripheral bonding region formed thereon

↓ etching the water/oxygen blocking layer on the base substrate, so as to at least remove the water/oxygen blocking layer on a connection terminal in the bonding region and to retain the water/oxygen blocking layer on the OLEDs

FIG.1

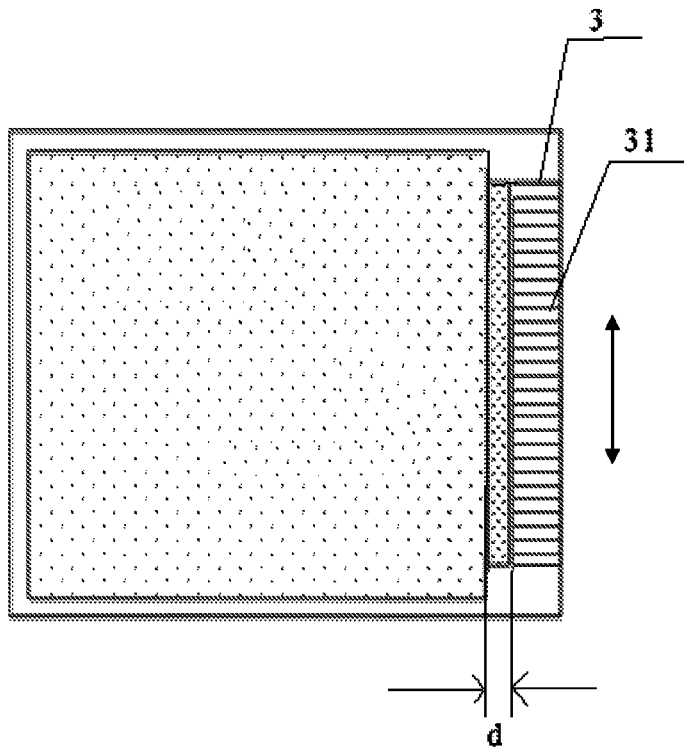

FIG.2

PACKAGING METHOD OF ORGANIC LIGHT EMITTING DISPLAY PANEL, ORGANIC LIGHT EMITTING DISPLAY PANEL AND DISPLAY DEVICE

The application is a U.S. National Phase Entry of International Application No. PCT/CN2014/087898 filed on Sep. 30, 2014, designating the United States of America and claiming priority to Chinese Patent Application No. 201410232262.0 filed on May 28, 2014. The present application claims priority to and the benefit of the above-identified applications and the above-identified applications are incorporated by reference herein in their entirety.

TECHNICAL FIELD

At least one embodiment of the present invention relates to a packaging method for an organic light emitting display panel, an organic light emitting display panel and a display device.

BACKGROUND

In the field of display technology, organic light emitting display panels have become the mainstream of display areas gradually by virtue of the merits of fast response speed, wide color gamut, ultra-thin, being usable for realizing flexibility, and so on, as compared to liquid crystal displays.

A plurality of organic light emitting diodes (OLEDs) arranged in a matrix form and circuits in a peripheral bonding region are provided on an organic light emitting display panel. A cathode of an organic light emitting diode is made of a metal material that is relatively active, and is very prone to be oxidized by moisture and oxygen gas in air. Oxidation of the cathode will lead to an irreversible impact on the cathode and material for an organic layer in the OLED, shortening the lifetime of the OLED, and even to damage the OLED. Therefore, a packaging procedure for OLEDs of an organic light emitting display panel is very important. OLEDs on the organic light emitting display panel are generally packaged by an organic or inorganic material, so as to completely package the region corresponding to OLEDs on the organic light emitting display panel, and to expose circuits in the peripheral bonding region.

Organic light emitting display panels are generally packaged by an atomic layer deposition (ALD) method, and the packaging method includes the following steps.

Step 1: an organic light emitting display panel in which OLEDs in a display region and circuits in a peripheral bonding region have been produced is prepared.

Step 2: with a mask including pattern of the bonding region, film formation for a water/oxygen blocking layer is conducted on the organic light emitting display panel as stated in the step 1. The film layer formed in the film formation is a package layer, and for the film formation process, deposition is performed by using an atomic layer deposition method. The mask includes a sheltering region that corresponds at least to the bonding region and a hollow region that corresponds to a region covered by each of the OLEDs. With the mask, the water/oxygen blocking layer is formed in the region where OLEDs are located for package of the OLEDs, and due to the shelter effect of the mask, the bonding region has no water/oxygen blocking layer formed therein and is exposed.

SUMMARY

According to at least one embodiment of the present invention, there are provided a packaging method for an organic light emitting display panel, an organic light emitting display panel and a display device, so as to achieve an organic light emitting display panel with a narrow frame.

The packaging method for the organic light emitting display panel provided by at least one embodiment of the invention includes forming a water/oxygen blocking layer that covers a whole base substrate on the base substrate with an organic light emitting device and a peripheral bonding region formed thereon; etching the water/oxygen blocking layer on the base substrate, so as to at least remove the water/oxygen blocking layer on a connection terminal within the bonding region, and to retain the water/oxygen blocking layer on the organic light emitting device.

According to at least one embodiment of the invention, there is provided an organic light emitting display panel, which includes an organic light emitting device situated in a display region, and a bonding region located on the periphery, wherein, the organic light emitting display panel is packaged by using the above packaging method.

According to at least one embodiment of the invention, there is provided a display device, which includes the above organic light emitting display panel.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

FIG. 1 is a schematically overall flowchart illustrating a packaging method for an organic light emitting display panel provided by an embodiment of the invention;

FIG. 2 is the first schematic view illustrating relative positions of a connection terminal and a bonding region provided by an embodiment of the invention;

DETAILED DESCRIPTION

Figure 3:
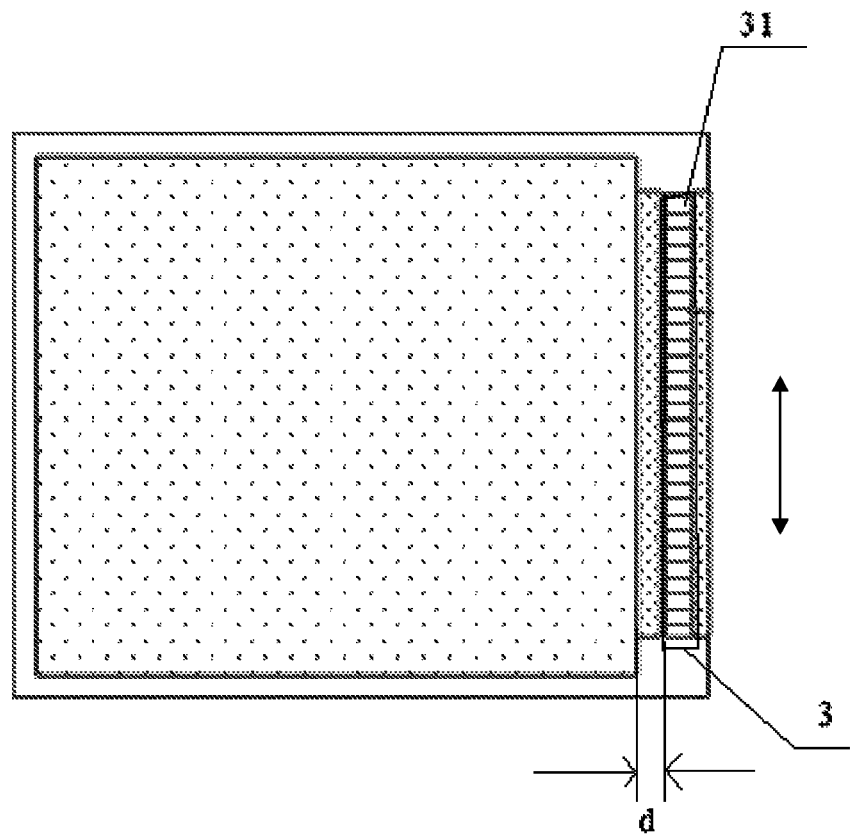
FIG. 3 is the second schematic view illustrating relative positions of a connection terminal and a bonding region provided by an embodiment of the invention.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

As having noted by inventors of the present application, in the event that film formation is performed on a substrate with OLEDs formed thereon by using a mask and an ALD technology, the thin film formed by the ALD technology has a better step coverage property, and the area of a film layer formed on the substrate corresponding to a hollow region of the mask is larger than the area of the hollow region. For example, in general, the step coverage property of the thin film formed by the ALD technology is about 5 mm to 10 mm. Thus, the distance between a connection terminal and an edge of the thin film encapsulation, which are obtained by adopting the mask process, is approximately in the range of 5 mm and 10 mm, and so it is difficult to achieve a narrower frame.

According to at least one embodiment of the invention, there is provided a packaging method for an organic light emitting display panel. By means of this packaging method for an organic light emitting display panel, the organic light emitting display panel can be formed with a narrow frame.

Technical solutions provided by embodiments of the invention will be specifically described below in conjunction with attached drawings.

The packaging method for the organic light emitting display panel provided by at least one embodiment of the invention includes: forming a water/oxygen blocking layer that covers a whole base substrate on the base substrate with an organic light emitting device and a peripheral bonding region formed thereon; etching the water/oxygen blocking layer on the base substrate, so as to at least remove the water/oxygen blocking layer on a connection terminal within the bonding region and to retain the water/oxygen blocking layer on the organic light emitting device. The water/oxygen blocking layer on the organic light emitting device is used for packaging the OLED so as to prevent external water, oxygen gas, nitrogen gas, and/or the like from entering the OLED and affecting the performance of the OLED or damaging the OLED.

FIG. 1 is a schematically overall flowchart illustrating a packaging method for an organic light emitting display panel provided by an embodiment of the invention. As shown in FIG. 1, the packaging method includes the following steps.

S11, on a base substrate with an organic light emitting device and a peripheral bonding region formed thereon, a water/oxygen blocking layer that covers the whole base substrate is formed.

The water/oxygen blocking layer may be an organic resin layer or an inorganic insulating layer, and for example, it may be an aluminum oxide layer, a silicon nitride or silicon oxide layer, or the like. When the OLED is a top-emission structure, outgoing light goes through the water/oxygen blocking layer, and for the sake of avoiding the obstruction of the water/oxygen blocking layer to the light emitted by the OLED, for example, the water/oxygen blocking layer may be a transparent film layer.

S12, the water/oxygen blocking layer is etched, so as to at least remove the water/oxygen blocking layer on a connection terminal within the bonding region and to retain the water/oxygen blocking layer on the organic light emitting device.

At least removing the water/oxygen blocking layer on the connection terminal within the bonding region may include the following two implementing modes.

Mode 1: all water/oxygen blocking layer in the bonding region is removed.

Mode 2: the water/oxygen blocking layer on a connection terminal within the bonding region is removed, namely, the water/oxygen blocking layer except for that on the connection terminal is retained.

The size and location of the bonding region of the organic light emitting display panel can be determined according to actual demands. For example, as shown in FIG. 2, the size of a bonding region 3 of the organic light emitting display panel along the direction denoted by an arrow in FIG. 2 may be comparable to a region covered by a connection terminal 31. The bonding region is situated in a region extending at a certain distance from an edge of a substrate toward the center. As shown in FIG. 3, the size of a bonding region 3 of the organic light emitting display panel along the direction denoted by an arrow in FIG. 3 may be smaller than a region covered by a connection terminal 31, and the bonding region is situated in a region away from an edge of the substrate at a set distance.

In a different embodiment, with respect to organic light emitting display panels shown in FIG. 2 and FIG. 3, the distance d between a bonding region and a water/oxygen blocking layer for packaging OLEDs can be made to be in the range of 0.1 mm to 2 mm, and it is ensured that encapsulation of OLEDs is good, and the bonding region is exposed.

In one embodiment, the water/oxygen blocking layer may be formed on the base substrate by an atomic layer deposition method.

In one embodiment, the water/oxygen blocking layer on the base substrate may be etched by a plasma etching method or a laser etching method. For example, the water/oxygen blocking layer is etched by oxygen plasma or air plasma.

In diverse embodiment, before the water/oxygen blocking layer is etched, the packaging method for the organic light emitting display panel may further include forming an etch protective layer on the water/oxygen blocking layer, so that the organic light emitting device is covered by the etch protective layer, and a connection terminal in the bonding region is at least exposed; or, placing a mask on the water/oxygen blocking layer. An opening region that at least corresponds to the connection terminal in the bonding region is provided on the mask, and a sheltering region of the mask corresponds to the organic light emitting device. With the etch protective layer, the water/oxygen blocking layer on the organic light emitting device can be prevented from being etched off.

In one embodiment, after the water/oxygen blocking layer is etched, the packaging method for the organic light emitting display panel may further include: removing the etch protective layer on the water/oxygen blocking layer.

In a different embodiment, the distance between the bonding region and the etched water/oxygen blocking layer is in the range of 0.1 mm to 2 mm.

The packaging method for the organic light emitting display panel provided by afore-mentioned embodiments of the invention will be specifically described below in conjunction with attached drawings.

Step 1: on a base substrate with an organic light emitting device and a connection terminal in a peripheral bonding region formed thereon, a water/oxygen blocking layer that covers the whole base substrate is formed by an atomic layer deposition (ALD) method.

Figure 4:
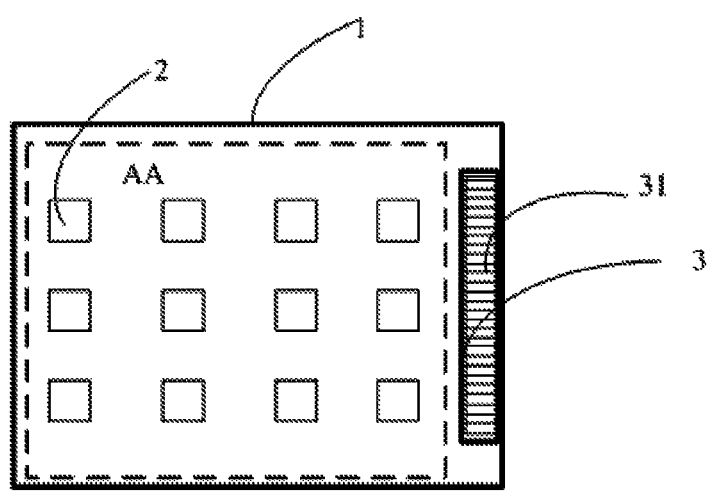
FIG. 4 is a schematic top view illustrating an unpackaged organic light emitting display panel provided by an embodiment of the invention.

With respect to an unpackaged organic light emitting display panel as shown in FIG. 4, the organic light emitting display panel includes a base substrate 1 and a plurality of organic light emitting devices 2 in a display region (region AA) and a peripheral bonding region 3 that are located on the base substrate 1. A connection terminal 31 is provided in the peripheral bonding region; and it may be a circuit connection wire for a chip bonding region (IC bonding region) on the organic light emitting display panel. The connection terminal 31 may be exposed after packaging of the organic light emitting display panel, so as to facilitate bonding to an IC.

Figure 5:
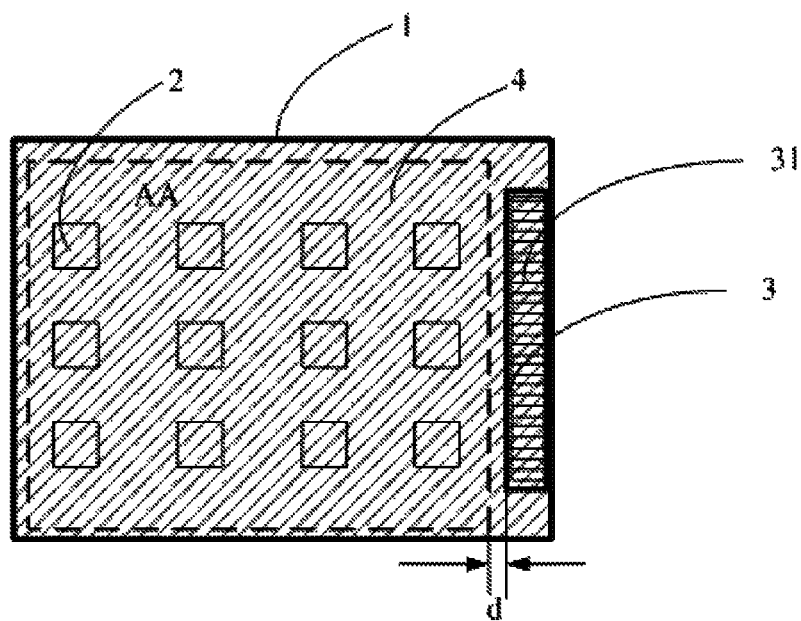
FIG. 5 is a schematic top view illustrating the organic light emitting display panel shown in FIG. 4 with a water/oxygen blocking layer formed thereon.

FIG. 5 is a schematic top view illustrating the organic light emitting display panel shown in FIG. 4 with a water/oxygen blocking layer 4 formed thereon.

Atomic layer deposition (ALD) is a vapor deposition method of thin film, and the deposited material covers all the portions on the base substrate. A water/oxygen blocking layer formed by the ALD method has superiority over a water/oxygen blocking layer formed by other thin film deposition technology, and the reason is that the film grown by ALD is typically bonded to a base material conformally and chemically without pinholes. By using the ALD method, a coating with a uniform thickness can be deposited in a deep trench, in a porous medium and around the grains.

The water/oxygen blocking layer may be an organic resin layer or an inorganic insulating layer, and for example, it may be an aluminum oxide ($Al_2O_3$) layer, or a silicon nitride (SiNx) or silicon oxide (SiOx) layer. When the OLED is a top-emission structure, outgoing light goes through the water/oxygen blocking layer, and for the sake of avoiding the obstruction of the water/oxygen blocking layer to the light emitted by the OLED, for example, the water/oxygen blocking layer may be a transparent film layer.

Step 2: the water/oxygen blocking layer on the organic light emitting device is covered by an etch protective layer, so as to expose the water/oxygen blocking layer in a bonding region. The etch protective layer is a protective film layer serving a function of preventing the covered object from being etched off during the etching process, and is also called as covering.

The etch protective layer may be a mask, and may also be a sheltering film layer that can be stripped off.

In the case that the etch protective layer is a sheltering film layer that can be stripped off, for example, an etch protective layer may be attached to the water/oxygen blocking layer in a region corresponding to the organic light emitting device, exposing a region of the water/oxygen blocking layer, which region is in correspondence with the bonding region.

In the case that the etch protective layer is a mask, for example, a mask may be placed on the base substrate with a water/oxygen blocking layer formed thereon. On the mask, an opening region corresponding to the bonding region is arranged, and an etch protective region is arranged in a region corresponding to the organic light emitting device.

Figure 6:
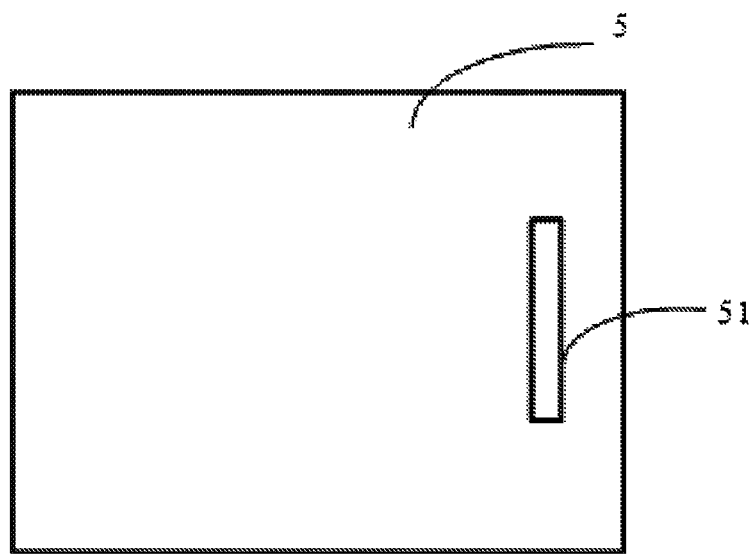
FIG. 6 is a structurally schematic top view illustrating a mask provided by an embodiment of the invention.
Figure 7:
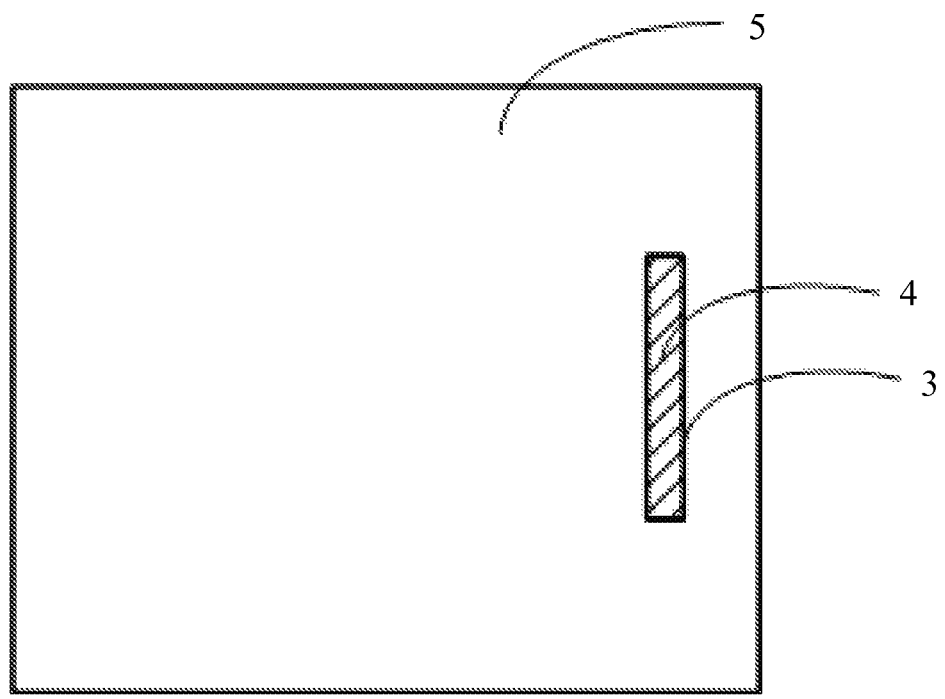
FIG. 7 is a schematic view illustrating relative positions of the mask shown in FIG. 6 and the organic light emitting display panel shown in FIG. 5 before etching.

FIG. 6 is a schematic top view illustrating a mask 5 provided by an embodiment of the invention; and FIG. 7 is a schematic view illustrating relative positions of the mask as shown in FIG. 6 and the organic light emitting display panel as shown in FIG. 5 before etching. In the case that the etch protective layer is a mask, as shown in FIG. 6 and FIG. 7, the mask 5 is located over the organic light emitting display panel, and an opening 51 on the mask 5 corresponds to a bonding region 3 on the organic light emitting display panel. Namely, projections of the opening 51 of the mask 5 and the bonding region 3 of the organic light emitting display panel overlap each other. Alternatively, the opening 51 is slightly larger than the area of the bonding region 3, so as to ensure that a connection terminal in the bonding region 3 is fully exposed for its convenience in realizing good bonding to an IC chip.

The step 2 is optional.

Step 3: The water/oxygen blocking layer is etched by a plasma etching method or a laser etching method, so as to remove the water/oxygen blocking layer corresponding to the bonding region, and to retain the water/oxygen blocking layer corresponding to the organic light emitting device. That is to say, a part of the water/oxygen blocking layer 4 corresponding to the opening 51 of the mask 5 shown in FIG. 7 is removed, and the bonding region 3 corresponding to the opening 51 is exposed.

In a different embodiment, the plasma etching method may be oxygen plasma or air plasma etching method or other etching method.

By means of plasma or laser etching method, the pattern and size of the water/oxygen blocking layer that has been subjected to etching almost correspond to the pattern and size of the opening 51 of the mask 5, and this is because that the etching precision of plasma or laser etching method is relative higher, and is on the order of micrometers. As shown in FIG. 5, the distance "d" between the bonding region and the water/oxygen blocking layer for packaging the OLED can be made to be in the range of 0.1 mm to 2 mm, and it is ensured that the OLED packaging is good, and the bonding region is exposed fully.

The distance between the bonding region and the water/oxygen blocking layer may be in the range of 0.1 mm to 2 mm. As such, an organic light emitting display panel with a narrower frame can be achieved. As compared with an organic light emitting display panel in which the distance between a connection terminal and a water/oxygen blocking layer for packaging an OLED is in the range of 5 mm to 10 mm, with the aid of the packaging method for the organic light emitting display panel provided by embodiments of the invention, the width of a frame region can be decreased by about 3 mm to 9.9 mm.

Step 4: the etch protective layer on the water/oxygen blocking layer is removed.

In the case that the etch protective layer is a sheltering film layer that can be stripped off, the etch protective layer may be stripped off. In the case that the etch protective layer is a mask, the mask may be removed away.

According to at least one embodiment of the invention, there is provided an organic light emitting display panel, which includes an organic light emitting device situated in a display region, and a bonding region located on the periphery, the organic light emitting display panel being packaged by using the above packaging method for the organic light emitting display panel.

In a different embodiment, the distance between the bonding region and the water/oxygen blocking layer that covers the organic light emitting device is in the range of 0.1 mm to 2 mm.

According to at least one embodiment of the invention, there is provided a display device, which includes any of the above-mentioned organic light emitting display panel. The display device may be an electronic paper, a cell phone, a tablet computer, a television, a display, a notebook computer, a digital photo frame, a navigator or any other product or component having a display function.

With respect to the packaging method for the organic light emitting display panel, the organic light emitting display panel and the display device provided by embodiments of the invention, a water/oxygen blocking layer that covers a whole base substrate is formed on the base substrate with an organic light emitting device and a connection terminal in a peripheral bonding region formed thereon by an atomic layer deposition method; the water/oxygen blocking layer on the base substrate is etched by plasma etching method or laser etching method, so as to remove the water/oxygen blocking layer in the bonding region, and to retain the water/oxygen blocking layer on the organic light emitting device. Film deposition encapsulation by way of atomic layer deposition is an effective way for OLED device packaging, and use of this technology has the merit of good packaging effect. This makes it hard for water molecules, oxygen gas and the like in air to enter the OLED, and the sealing effect is good. By means of forming a water/oxygen blocking layer on an organic light emitting device and a peripheral bonding region, and etching the water/oxygen blocking layer on the base substrate by plasma etching method or laser etching method, so as to remove the water/oxygen blocking layer in the bonding region, and to retain the water/oxygen blocking layer on the organic light emitting device, accurate control of the coverage area of the water/oxygen blocking layer around the bonding region can be realized.

Apparently, various modifications and variants can be made to the present invention by those skilled in the art without departing from the spirit and scope of the invention. As such, provided that these modifications and variants of the invention fall within the scope of claims of the present invention and their equivalent technologies, it is intended for the invention to embrace them therein.

This application claims the benefit of priority from Chinese patent application No. 201410232262.0, filed on May 28, 2014, the disclosure of which is incorporated herein in its entirety by reference as a part of the present application.

What is claimed is:

1. A packaging method for an organic light emitting display panel, comprising:
    forming a water/oxygen blocking layer that covers a whole base substrate on the base substrate with an organic light emitting device and a peripheral bonding region formed thereon; and
    etching the water/oxygen blocking layer on the base substrate, so as to at least remove the water/oxygen blocking layer on a connection terminal within the bonding region and to retain the water/oxygen blocking layer on the organic light emitting device,
    wherein the water/oxygen blocking layer on the base substrate is etched by a plasma etching method or a laser etching method, and
    wherein a distance between the bonding region and the water/oxygen blocking layer that covers the organic light emitting device is in a range of 0.1 mm to 2 mm.

2. The packaging method claimed as claim 1, wherein the water/oxygen blocking layer is formed on the base substrate by an atomic layer deposition method.

3. The packaging method claimed as claim 2, wherein the water/oxygen blocking layer on the base substrate is etched by a plasma etching method or a laser etching method.

4. The packaging method claimed as claim 3, wherein the water/oxygen blocking layer is etched by oxygen plasma or air plasma.

5. The packaging method claimed as claim 2, before the water/oxygen blocking layer is etched, further comprising:
    forming an etch protective layer on the water/oxygen blocking layer, so that the organic light emitting device is covered by the etch protective layer, and the connection terminal in the bonding region is at least exposed; or
    placing a mask on the water/oxygen blocking layer, with an opening region at least corresponding to the connection terminal in the bonding region being provided on the mask and a sheltering region of the mask corresponding to the organic light emitting device.

6. The packaging method claimed as claim 5, after the water/oxygen blocking layer is etched, further comprising: removing the etch protective layer on the water/oxygen blocking layer.

7. The packaging method claimed as claim 1, wherein the water/oxygen blocking layer is etched by oxygen plasma or air plasma.

8. The packaging method claimed as claim 1, wherein the water/oxygen blocking layer is an aluminum oxide layer, a silicon nitride or silicon oxide layer.

9. The packaging method claimed as claim 1, before the water/oxygen blocking layer is etched, further comprising:
    forming an etch protective layer on the water/oxygen blocking layer, so that the organic light emitting device is covered by the etch protective layer, and the connection terminal in the bonding region is at least exposed; or
    placing a mask on the water/oxygen blocking layer, with an opening region at least corresponding to the connection terminal in the bonding region being provided on the mask and a sheltering region of the mask corresponding to the organic light emitting device.

10. The packaging method claimed as claim 9, after the water/oxygen blocking layer is etched, further comprising: removing the etch protective layer on the water/oxygen blocking layer.

11. An organic light emitting display panel, comprising an organic light emitting device situated in a display region, and a bonding region located on the periphery,
    wherein the organic light emitting display panel is packaged by using the packaging method claimed as claim 1.

12. A display device, comprising the organic light emitting display panel claimed as claim 11.

13. The packaging method claimed as claim 1, before the water/oxygen blocking layer is etched, further comprising:
    forming an etch protective layer on the water/oxygen blocking layer, so that the organic light emitting device is covered by the etch protective layer, and the connection terminal in the bonding region is at least exposed; or
    placing a mask on the water/oxygen blocking layer, with an opening region at least corresponding to the connection terminal in the bonding region being provided on the mask and a sheltering region of the mask corresponding to the organic light emitting device.

14. The packaging method claimed as claim 13, after the water/oxygen blocking layer is etched, further comprising: removing the etch protective layer on the water/oxygen blocking layer.

* * * * *